US010510404B2

(12) United States Patent
Shah

(10) Patent No.: US 10,510,404 B2
(45) Date of Patent: *Dec. 17, 2019

(54) WRITE ASSIST CIRCUIT OF MEMORY DEVICE

(71) Applicant: TAIWAN SEMICONDUCTOR MANUFACTURING CO., LTD., Hsinchu (TW)

(72) Inventor: Jaspal Singh Shah, Ottawa (CA)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/391,139

(22) Filed: Apr. 22, 2019

(65) Prior Publication Data
US 2019/0252018 A1    Aug. 15, 2019

Related U.S. Application Data

(63) Continuation of application No. 15/202,387, filed on Jul. 5, 2016, now Pat. No. 10,269,418.

(60) Provisional application No. 62/271,960, filed on Dec. 28, 2015.

(51) Int. Cl.
*G11C 7/22* (2006.01)
*G11C 11/00* (2006.01)
*G11C 11/419* (2006.01)

(52) U.S. Cl.
CPC ................. *G11C 11/419* (2013.01)

(58) Field of Classification Search
CPC ... G11C 11/419; G11C 11/412; G11C 11/413; G11C 7/12; G11C 8/16; G11C 11/417; G11C 11/418; G11C 7/1051; G11C 7/1069
See application file for complete search history.

(56) References Cited

U.S. PATENT DOCUMENTS

| 5,973,985 A | 10/1999 | Ferrant |
| 7,710,763 B2 | 5/2010 | Houston |
| 8,164,938 B2 | 4/2012 | Kuroda et al. |
| 9,324,415 B2 | 4/2016 | Katoch |
| 9,449,663 B2 | 9/2016 | Yang et al. |
| 9,640,540 B1 | 5/2017 | Liaw |
| 10,269,418 B2 * | 4/2019 | Shah ..................... G11C 11/419 |
| 2003/0007381 A1 | 1/2003 | Regev |

(Continued)

FOREIGN PATENT DOCUMENTS

| CN | 101071634 A | 11/2007 |
| CN | 101999147 A | 3/2011 |

(Continued)

*Primary Examiner* — Hien N Nguyen
(74) *Attorney, Agent, or Firm* — Maschoff Brennan

(57) ABSTRACT

A device including a memory cell is disclosed. The memory cell includes a first inverter and a second inverter cross-coupled with the first inverter. The first inverter is operated with a first operational voltage and a third operational voltage, and the second inverter is operated with a second operational voltage and a fourth operational voltage. During a write operation of the memory cell, the first operational voltage and the second operational voltage are configured at different voltage levels, and the third operational voltage and the fourth operational voltage are configured at the same voltage level.

20 Claims, 6 Drawing Sheets

(56) References Cited

U.S. PATENT DOCUMENTS

| | | |
|---|---|---|
| 2007/0211517 A1 | 9/2007 | Burnett |
| 2014/0112081 A1 | 4/2014 | Grover et al. |
| 2014/0204657 A1 | 7/2014 | Dally |
| 2014/0204687 A1 | 7/2014 | Sinangil et al. |
| 2015/0009751 A1 | 1/2015 | Kulkarni et al. |
| 2015/0043270 A1 | 2/2015 | Singh et al. |
| 2015/0138902 A1 | 5/2015 | Chiu et al. |

FOREIGN PATENT DOCUMENTS

| | | |
|---|---|---|
| CN | 102867541 A | 1/2013 |
| CN | 103943141 A | 7/2014 |
| CN | 103943143 A | 7/2014 |
| CN | 104051003 A | 9/2014 |
| CN | 104700887 A | 6/2015 |

\* cited by examiner

WRITE ASSIST CIRCUIT OF MEMORY DEVICE

CROSS-REFERENCE TO RELATED APPLICATION

This application is a continuation of U.S. application Ser. No. 15/202,387, filed Jul. 5, 2016, now U.S. Pat. No. 10,269,418, issued on Apr. 23, 2019, which claims the priority benefit of U.S. Provisional Application Ser. No. 62/271,960, filed Dec. 28, 2015. This application is also related to U.S. application Ser. No. 15/804,954, filed Nov. 6, 2017, now U.S. Pat. No. 10,102,901, issued on Oct. 16, 2018. The full disclosures of the foregoing patents and patent applications are incorporated herein by reference.

BACKGROUND

Memory is an important component in a computer, and many different memory structures have been developed for different applications. For example, the memory structures include dynamic random access memory (DRAM), static random-access memory (SRAM), read-only memory (ROM), flash memory, etc. A conventional structure of a SRAM cell is a six transistor (6T) cell. The SRAM cell includes a pair of cross-coupled inverters. A SRAM cell can be utilized to store a digital bit of data between the inverters.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
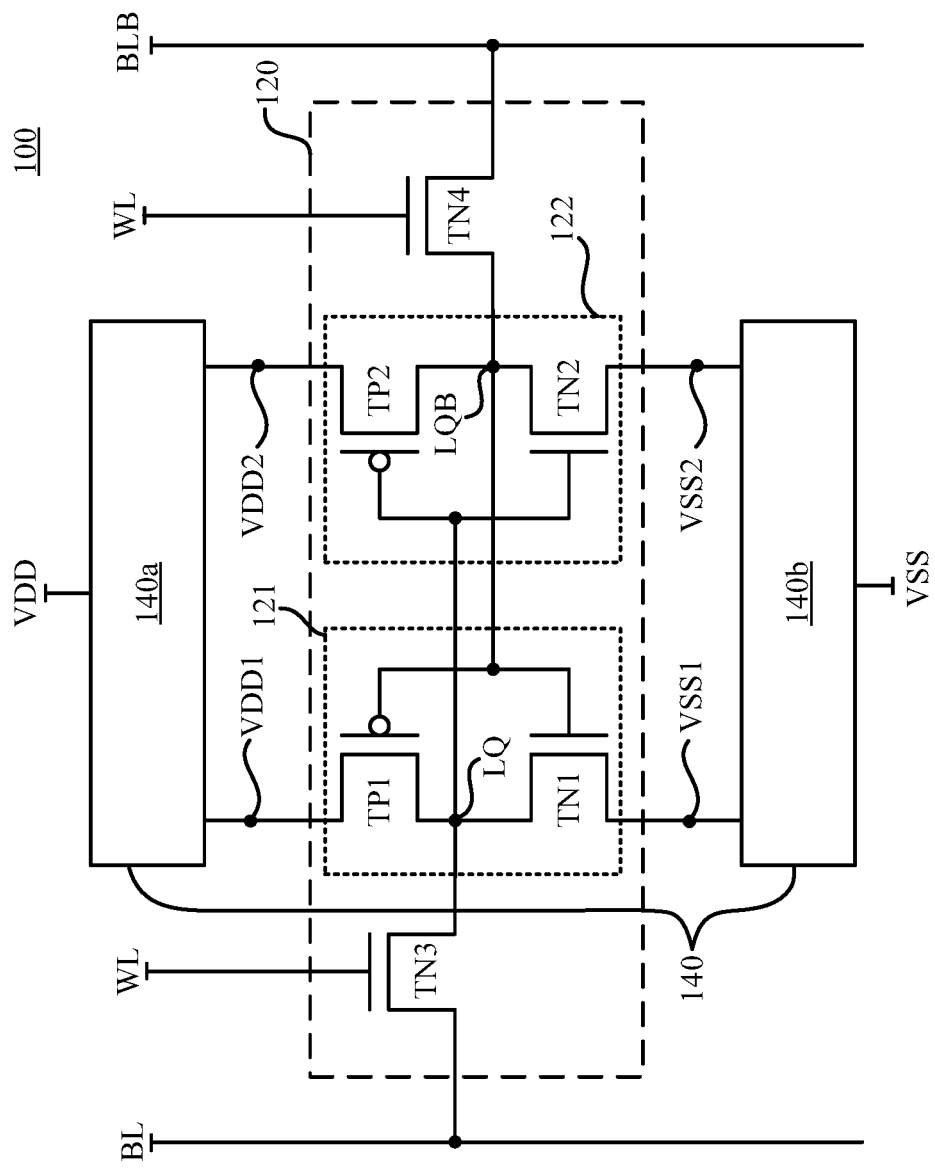
FIG. 1 is a schematic diagram illustrating a memory device according to some embodiments of the present disclosure.

FIG. 1 is a schematic diagram illustrating a memory device 100 according to some embodiments of the present disclosure. The memory device 100 includes a memory cell 120 and a write assist circuit 140. The write assist circuit 140 is coupled to the memory cell 120, as shown in FIG. 1.

In some embodiments, the memory device 100 includes a number of memory cells 120, and the memory cells 120 are arranged by columns and rows in a memory cell array (not shown in figures). For illustrative purposes, only one memory cell 120 is illustrated in FIG. 1. Various numbers of the memory cells 120 are within the contemplated scope of the present disclosure.

In some embodiments, the memory cell 120 includes a first inverter 121 and a second inverter 122. The first inverter 121 and the second inverter 122 are cross-coupled. Effectively, the first inverter 121 and the second inverter 122 operate as a data latch. For illustration, an output node of the first inverter 121 and an input node of the second inverter 122 are connected together at a node LQ shown in FIG. 1. An input node of the first inverter 121 and an output node of the second inverter 122 are connected together at a node LQB shown in FIG. 1.

For illustration of operation, the data latch, including the first inverter 121 and the second inverter 122, is able to store a bit of data at the node LQ. For illustration, a voltage level on the node LQ is able to be configured at different voltage levels. The voltage level of the node LQ represents logic "1" or logic "0" corresponding to logic data stored in the memory cell 120. The node LQB has a logical level opposite to that of the node LQ. For convenience of illustration hereinafter, logic "0" indicates a low level, and logic "1"

indicates a high level. The indications are given for illustrative purposes. Various indications are within the contemplated scope of the present disclosure.

In some embodiments, the memory cell 120 illustrated in FIG. 1 is a static random-access memory (SRAM) cell, including, for illustration, six transistors TN1-TN4 and TP1-TP2. The transistors TP1 and TN1 are configured and operate as the first inverter 121. The transistors TP2 and TN2 are configured and operate the second inverter 122. In some embodiments, the transistors TN1-TN4 are N-type transistors, and the transistors TP1-TP2 are P-type transistors.

In some embodiments, the transistor TN3 is configured as a first write transistor, and the transistor TN4 is configured as a second write transistor. For illustration, the transistor TN3 and the transistor TN4 are controlled by word line signals WL. The output node of the first inverter 121 and the input node of the second inverter 122, i.e., the node LQ, are coupled through the transistor TN3 to a bit line carrying a bit line signal BL. The input node of the first inverter 121 and the output node of the second inverter 122, i.e., the node LQB, are coupled through the transistor TN4 to a complementary bit line carrying a complementary bit line signal BLB.

In some embodiments, the memory device 100 includes multiple memory cells (not shown), and the word line signals WL are utilized to select and trigger at least one of the memory cells, for example, the memory cell 120, for a write/read operation of the memory device 100. When the memory cell 120 is not selected in response to the word line signals WL, the memory cell 120 maintains the same voltage levels on the node LQ and the node LQB.

In some embodiments, the write assist circuit 140 includes a write assist unit 140a and a write assist unit 140b. For illustration, the write assist unit 140a is coupled to the transistor TP1 of the first inverter 121 and coupled to the transistor TP2 of the second inverter 122. The write assist unit 140b is coupled to the transistor TN1 of the first inverter 121 and coupled to the transistor TN2 of the second inverter 122. The write assist unit 140a is configured to receive a reference voltage VDD, and provide an operational voltage VDD1 and an operational voltage VDD2 to the memory cell 120. The write assist unit 140b is configured to receive a reference voltage VSS, and provide an operational voltage VSS1 and an operational voltage VSS2 to the memory cell 120. In some embodiments, the reference voltage VDD is relatively higher than the reference voltage VSS. In some embodiments, the operational voltages VDD1 and VDD2 are relatively higher than the operational voltages VSS1 and VSS2.

As illustrated in FIG. 1, the operational voltage VDD1 is provided to the transistor TP1. The operational voltage VSS1 is provided to the transistor TN1. The operational voltage VDD2 is provided to the transistor TP2. The operational voltage VSS2 is provided to the transistor TN2.

In some embodiments, the reference voltage VDD is a power supply voltage, and in a range, for example, from approximately 0.5V to approximately 0.75V. In some embodiments, the reference voltage VSS is a ground voltage. In some other embodiments, the reference voltage VSS is configured from, for example, approximately −0.5V to approximately −0.75V.

In some embodiments, the operational voltages VDD1 and VDD2 are each equal to, or approximately equal to, the reference voltage VDD. In some embodiments, the operational voltages VSS1 and VSS2 are each equal to, or approximately equal to, the reference voltage VSS.

During a write operation, labeled as WR in FIG. 2A, FIG. 2B, FIG. 3A and FIG. 3B, of the memory cell 120, the write assist circuit 140 is configured to adjust at least one voltage level of the operational voltages VDD1, VDD2, VSS1, and VSS2 selectively by a bias voltage difference. The adjusted operational voltage is provided to the first inverter 121 and/or the second inverter 122 to assist the write operation of the memory cell 120. Details of aforesaid adjusting operations are discussed below, for example, with reference to FIG. 2A, FIG. 2B, FIG. 3A and FIG. 3B.

Figure 2A:
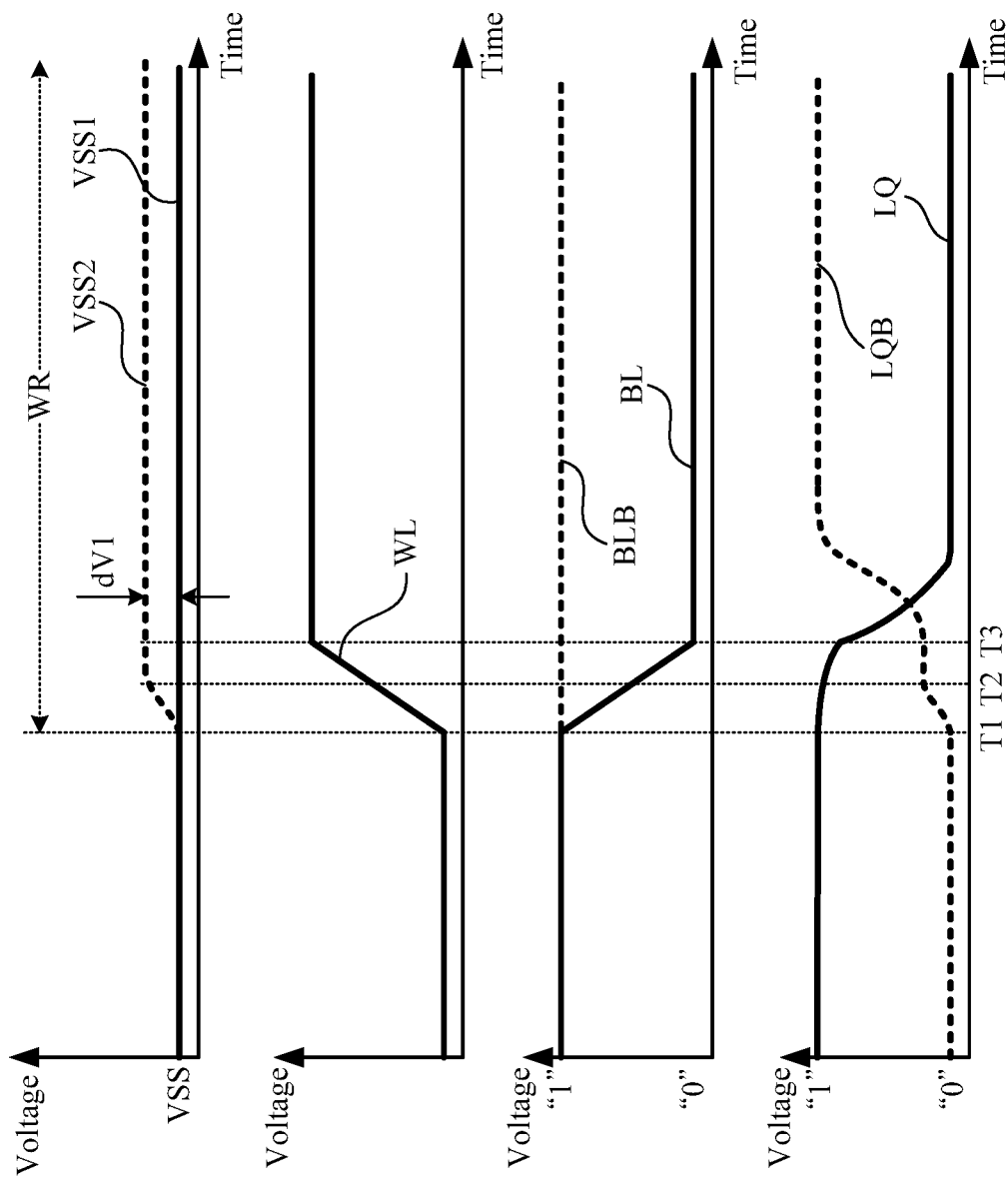
FIG. 2A is a schematic diagram of waveforms illustrating signals and voltages of the memory cell in FIG. 1 during a write operation according to some embodiments of the present disclosure.

FIG. 2A is a schematic diagram of waveforms illustrating signals and voltages of the memory cell 120 in FIG. 1 during a write operation WR, according to some embodiments of the present disclosure. With respect to the embodiments of FIG. 1, like elements in FIG. 2A are designated with the same reference numbers for ease of understanding. For illustration in FIG. 2A, the write operation WR is performed along with modifying the operational voltage VSS2, as will be discussed below with reference to FIG. 1.

As illustrated in FIG. 2A, before the time T1, the node LQ is set to logic "1" and the node LQB is set to logic "0."

For illustration in FIG. 2A, the write operation WR starts from the time T1. The write operation WR is performed to write logic "1" data to the node LQB, and to write logic "0" data to the node LQ in FIG. 1.

In some embodiments, during the write operation WR, the write assist unit 140b in FIG. 1 raises the operational voltage VSS2 from the time T1, by a bias voltage difference dV1 as illustrated in FIG. 2A.

During the same write operation WR, the operational voltage VSS1 remains equal to, or approximately equal to, the reference voltage VSS, as illustrated in FIG. 2A. The operational voltages VDD1 and VDD2 are equal to, or approximately equal to, the reference voltage VDD during the same write operation WR in some embodiments.

For illustration of operation, in response to the node LQ set to logic "1" before the time T1, the transistor TN2 in FIG. 1 is turned on. When the write operation WR is performed at the time T1, the write assist unit 140b start to raise the operational voltage VSS2.

At the time T2, the write assist unit 140b raises the operational voltage VSS2 by the bias voltage difference dV1. Accordingly, the raised operational voltage VSS2 is equal to (VSS+dV1). In response to the raised operational voltage VSS2, through the turn-on transistor TN2, the voltage level on the node LQB is also raised at the time T2. The raised voltage level on the node LQB causes the transistor TP1 to be turned off faster, and causes the transistor TN1 to be turned on faster, compared with operations without raising the voltage level on the node LQB beforehand.

At the time T3, the bit line signal BL is transited to logic "0," and the complementary bit line signal BLB remains at logic "1." Correspondingly, at the time T3, the word line signal WL is transited to logic "1." In response to the word line signal WL, the transistors TN3 and TN4 are both turned on. Accordingly, the bit line signal BL of logic "0" is provided through the turn-on transistor TN3 to the node LQ, and the complementary bit line signal BLB of logic "1" is provided through the turn-on transistor TN4 to the node LQB.

In response to the bit line signal BL of logic "0," the voltage level on the node LQ starts to be discharged to the voltage level of logic "0." In response to the complementary bit line signal BLB of logic "1," the voltage level on the node LQB starts to be charged to the voltage level of logic "1."

As discussed above, the raised operational voltage VSS2 raises the voltage level on the node LQB. The raised voltage level on the node LQB causes the transistor TN1 to be turned on faster. With the transistor TN1 being turned on faster, the voltage level on the node LQ is able to be pulled low to the operational voltage VSS1 faster, which causes the voltage level on the node LQ to be discharged to the voltage level of logic "0" faster.

Correspondingly, the raised voltage level on the node LQB causes the transistor TP1 to be turned off faster. With the transistor TP1 being turned off faster, the node LQ is able to be disconnected from the operational voltage VDD1 faster.

After the time T3, in response to the voltage level of the node LQ discharged to logic "0" faster, the transistor TP2 is turned on and the transistor TN2 is turned off faster. Accordingly, the voltage level of the node LQB is able to be charged, by the operational voltage VDD2, to logic "1" faster, compared with operations without raising the voltage level on the node LQB beforehand. Moreover, with the raised operational voltage VSS2, drain-to-source leakage currents through the transistors TP2 and TN2 are reduced.

Figure 2B:
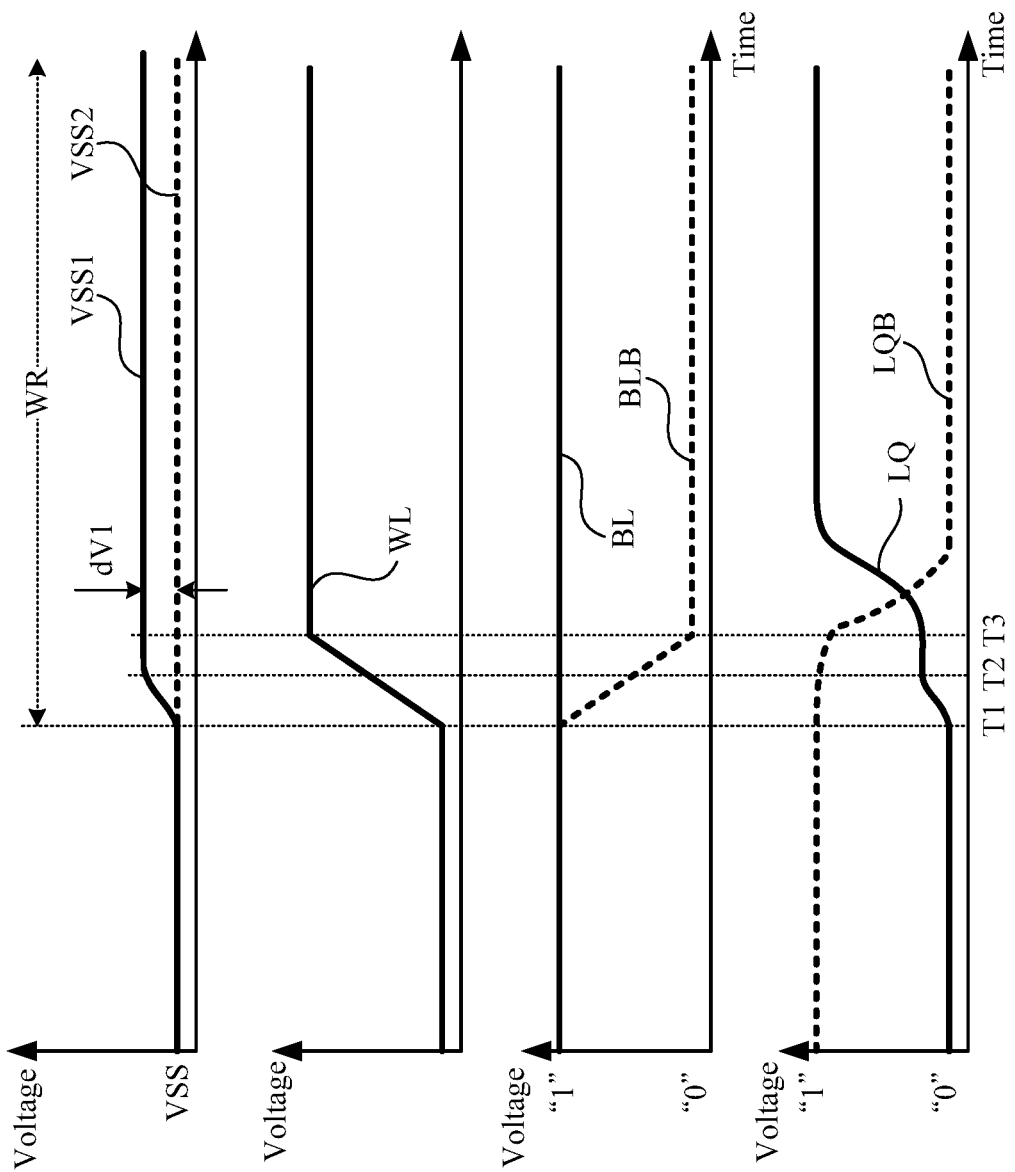
FIG. 2B is a schematic diagram of waveforms illustrating signals and voltages of the memory cell in FIG. 1 during a write operation according to some other embodiments of the present disclosure.

FIG. 2B is a schematic diagram of waveforms illustrating signals and voltages of the memory cell 120 in FIG. 1 during a write operation WR, according to some other embodiments of the present disclosure. With respect to the embodiments of FIG. 1 and FIG. 2A, like elements in FIG. 2B are designated with the same reference numbers for ease of understanding. For illustration in FIG. 2B, the write operation WR is performed along with modifying the operational voltage VSS1, as will be discussed below with reference to FIG. 1 and FIG. 2B.

As illustrated in FIG. 2B, before the time T1, the node LQ is previously set to logic "0" and the node LQB is set to logic "1."

For illustration in FIG. 2B, the write operation WR starts from the time T1. The write operation WR is performed to write logic "1" data to the node LQ, and to write logic "0" data to the node LQB in FIG. 1.

In some embodiments, during the write operation WR, the write assist unit 140*b* in FIG. 1 raises the operational voltage VSS1 from the time T1, by a bias voltage difference dV1 as illustrated in FIG. 2B.

During the same write operation WR, the operational voltage VSS2 remains equal to, or approximately equal to, the reference voltage VSS, as illustrated in FIG. 2B. The operational voltages VDD1 and VDD2 are equal to, or approximately equal to, the reference voltage VDD during the same write operation WR in some embodiments.

For illustration of operation, in response to the node LQB set to logic "1" before the time T1, the transistor TN1 in FIG. 1 is turned on. When the write operation WR is performed at the time T1, the write assist unit 140*b* start to raise the operational voltage VSS1.

At the time T2, the write assist unit 140*b* raises the operational voltage VSS1 by the bias voltage difference dV1. Accordingly, the raised operational voltage VSS1 is equal to (VSS+dV1). In response to the raised operational voltage VSS1, through the turn-on transistor TN1, the voltage level on the node LQ is also raised at the time T2. The raised voltage level on the node LQ causes the transistor TP2 to be turned off faster, and causes the transistor TN2 to be turned on faster, compared with operations without raising the voltage level on the node LQ beforehand.

At the time T3, the complementary bit line signal BLB is transited to logic "0," and the bit line signal BL remains at logic "1." Correspondingly, at the time T3, the word line signal WL is transited to logic "1." In response to the word line signal WL, the transistors TN3 and TN4 are both turned on. Accordingly, the bit line signal BL of logic "1" is provided through the turn-on transistor TN3 to the node LQ, and the complementary bit line signal BLB of logic "0" is provided through the turn-on transistor TN4 to the node LQB.

After the time T3, in response to the bit line signal BL of logic "1," the voltage level on the node LQ starts to be charged to the voltage level of logic "1." In response to the complementary bit line signal BLB of logic "0," the voltage level on the node LQB starts to be discharged to the voltage level of logic "0."

As discussed above, the raised operational voltage VSS1 raises the voltage level on the node LQ. The raised voltage level on the node LQ causes the transistor TN2 to be turned on faster. With the transistor TN2 being turned on faster, the voltage level on the node LQB is able to be pulled low to the operational voltage VSS2 faster, which causes the voltage level on the node LQB to be discharged to the voltage level of logic "0" faster.

Correspondingly, the raised voltage level on the node LQ causes the transistor TP2 to be turned off faster. With the transistor TP2 being turned off faster, the node LQB is able to be disconnected from the operational voltage VDD2 faster.

After the time T3, in response to the voltage level of the node LQB discharged to logic "0" faster, the transistor TP1 is turned on and the transistor TN1 is turned off faster. Accordingly, the voltage level of the node LQ is able to be charged, by the operational voltage VDD1, to logic "1" faster, compared with operations without raising the voltage level on the node LQ beforehand. Moreover, with the raised operational voltage VSS1, drain-to-source leakage currents through the transistors TP1 and TN1 are reduced.

Embodiments of FIG. 2A and FIG. 2B demonstrate that the write assist unit 140*b* raises the operational voltage VSS1 or the operational voltage VSS2 by the bias voltage difference dV1 during the write operation WR of the memory cell 120.

In some embodiments, an absolute value of the bias voltage difference dV1 is less than an absolute value of a threshold voltage of the transistors TN1-TN4 and TP1-TP2, i.e., |dV1|<|Vth|, and Vth is a threshold voltage of one of the transistors TN1-TN4 or TP1-TP2, such that the raised voltage level on the node LQ/LQB will not cause the transistors TN1-TN4 and TP1-TP2 to be switched. In some embodiments, the bias voltage difference dV1 is approximately 10% to approximately 30% of the reference voltage VDD of the memory device 100. In some embodiments, the bias voltage difference dV1 is 100 mV.

Figure 3A:
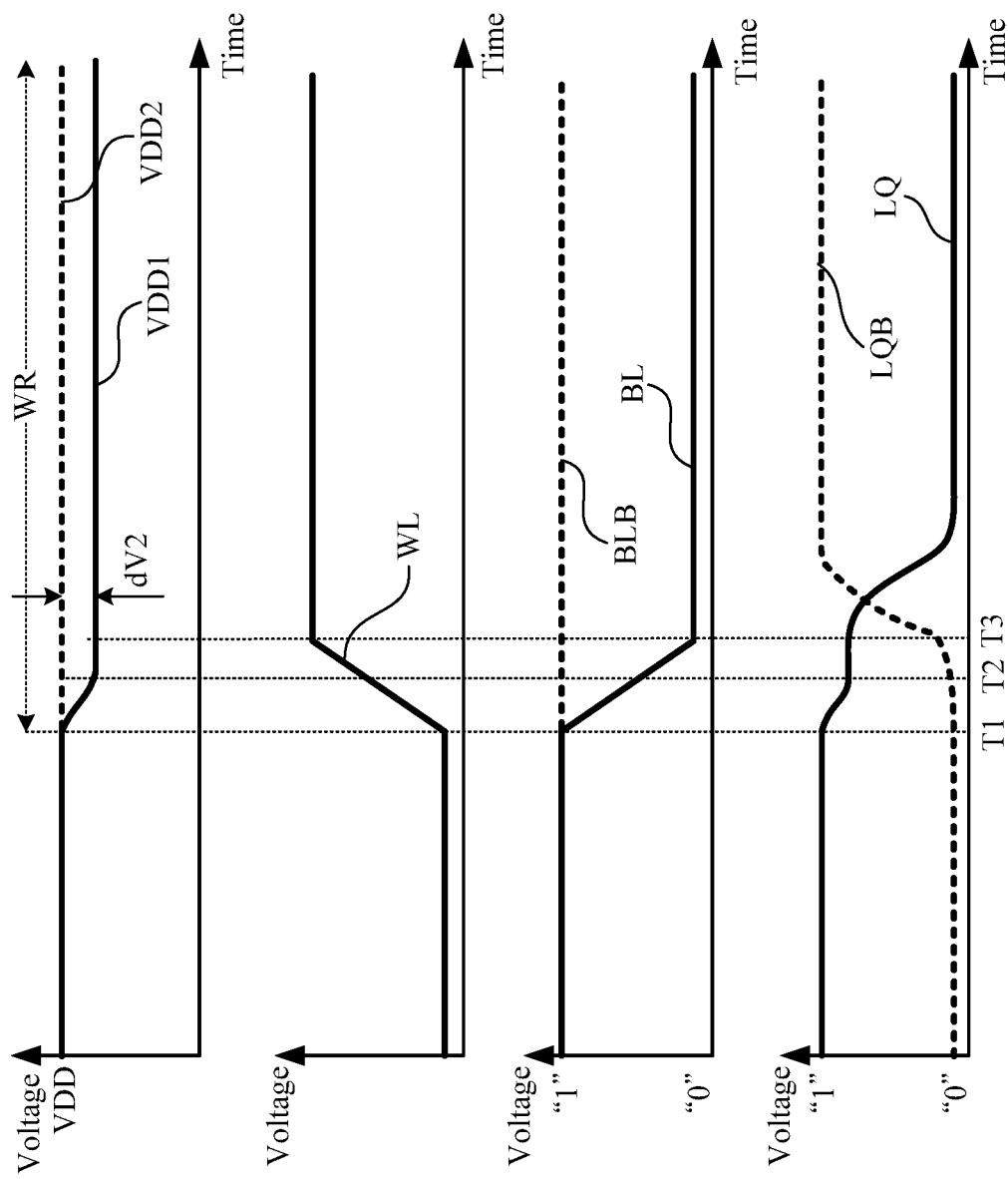
FIG. 3A is a schematic diagram of waveforms illustrating signals and voltages of the memory cell in FIG. 1 during a write operation according to some embodiments of the present disclosure.

FIG. 3A is a schematic diagram of waveforms illustrating signals and voltages of the memory cell 120 in FIG. 1 during a write operation WR, according to some embodiments of the present disclosure. With respect to the embodiments of FIG. 1, like elements in FIG. 3A are designated with the same reference numbers for ease of understanding. For illustration in FIG. 3A, the write operation WR is performed along with modifying the operational voltage VDD1, as will be discussed below with reference to FIG. 1 and FIG. 3A.

As illustrated in FIG. 3A, before the time T1, the node LQ is previously set to logic "1" and the node LQB is set to logic "0."

For illustration in FIG. 3A, the write operation WR starts from the time T1. The write operation WR is performed to write logic "0" data to the node LQ, and to write logic "1" data to the node LQB in FIG. 1.

In some embodiments, during the write operation WR, the write assist unit 140*a* in FIG. 1 reduces the operational voltage VDD1 from the time T1, by a bias voltage difference dV2 as illustrated in FIG. 3A.

During the same write operation WR, the operational voltage VDD2 remains equal to, or approximately equal to, the reference voltage VDD, as illustrated in FIG. 3A. The operational voltages VSS1 and VSS2 are equal to, or approximately equal to, the reference voltage VSS during the same write operation WR in some embodiments.

For illustration of operation, in response to the node LQB set to logic "0" before the time T1, the transistor TP1 in FIG. 1 is turned on. When the write operation WR is performed at the time T1, the write assist unit 140*a* start to reduce the operational voltage VDD1.

At the time T2, the write assist unit 140*a* reduces the operational voltage VDD1 by the bias voltage difference dV2. Accordingly, the reduced operational voltage VDD1 is equal to (VDD−dV2). In response to the reduced operational voltage VDD1, through the turn-on transistor TP1, the voltage level on the node LQ is also reduced at the time T2. The reduced voltage level on the node LQ causes the transistor TN2 to be turned off faster, and causes the transistor TP2 to be turned on faster, compared with operations without reducing the voltage level on the node LQ beforehand.

At the time T3, the bit line signal BL is transited to logic "0," and the complementary bit line signal BLB remains at logic "1." Correspondingly, at the time T3, the word line signal WL is transited to logic "1." In response to the word line signal WL, the transistors TN3 and TN4 are both turned on. Accordingly, the bit line signal BL of logic "0" is provided through the turn-on transistor TN3 to the node LQ, and the complementary bit line signal BLB of logic "1" is provided through the turn-on transistor TN4 to the node LQB.

After the time T3, in response to the bit line signal BL of logic "0," the voltage level on the node LQ starts to be discharged to the voltage level of logic "0." In response to the complementary bit line signal BLB of logic "1," the voltage level on the node LQB starts to be charged to the voltage level of logic "1."

As discussed above, the reduced operational voltage VDD1 reduces the voltage level on the node LQ. The reduced voltage level on the node LQ causes the transistor TP2 to be turned on faster. With the transistor TP2 being turned on faster, the voltage level on the node LQB is able to be pulled high to the operational voltage VDD2 faster, which causes the voltage level on the node LQB to be charged to the voltage level of logic "1" faster.

Correspondingly, the reduced voltage level on the node LQ causes the transistor TN2 to be turned off faster. With the transistor TN2 being turned off faster, the node LQB is able to be disconnected from the operational voltage VSS2 faster.

After the time T3, in response to the voltage level of the node LQB charged to logic "1" faster, the transistor TN1 is turned on and the transistor TP1 is turned off faster. Accordingly, the voltage level of the node LQ is able to be discharged, by the operational voltage VSS1, to logic "0" faster, compared with operations without reducing the voltage level on the node LQ beforehand. Moreover, with the reduced operational voltage VDD1, drain-to-source leakage currents through the transistors TP1 and TN1 are reduced.

Figure 3B:
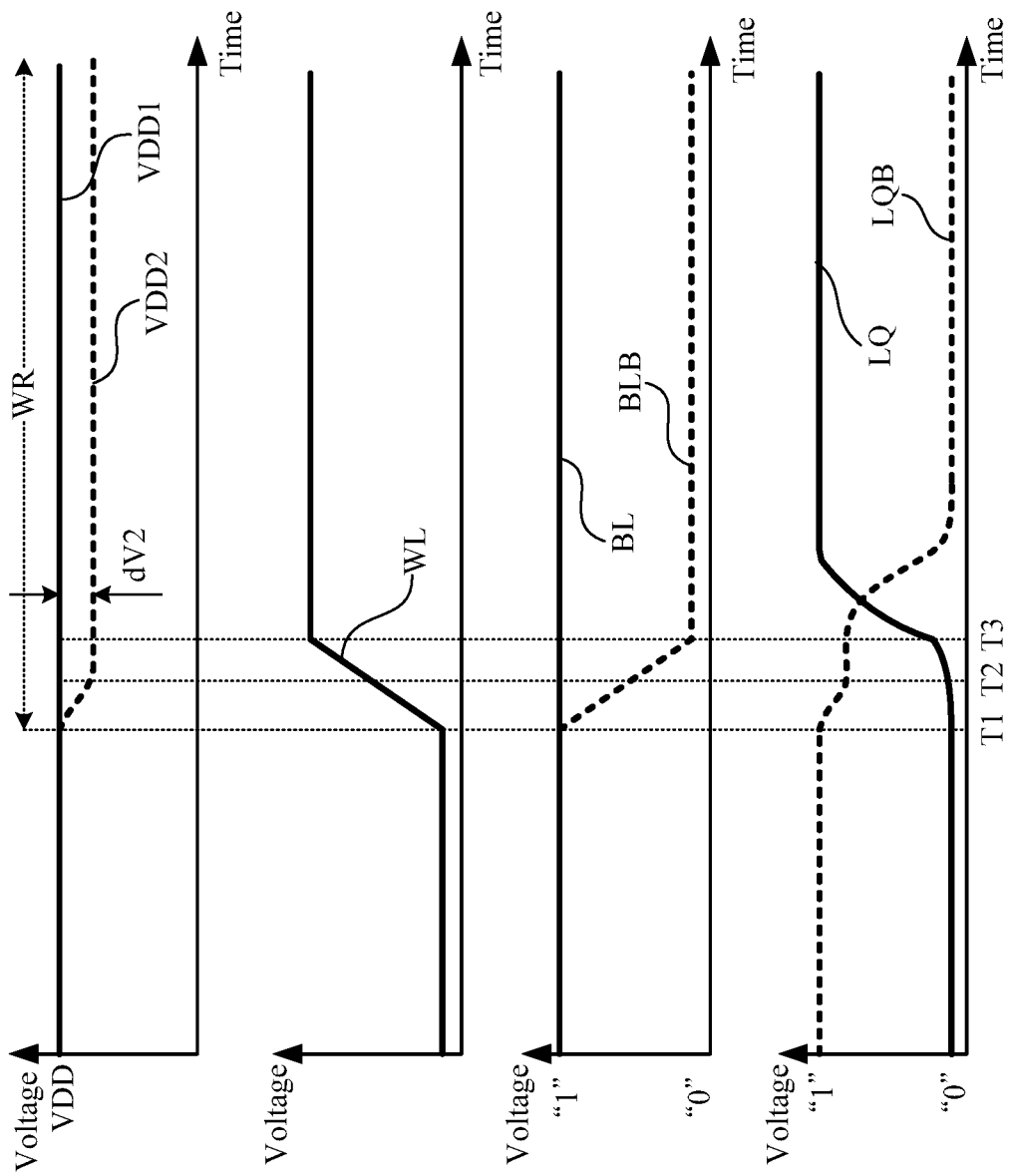
FIG. 3B is a schematic diagram of waveforms illustrating signals and voltages of the memory cell in FIG. 1 during a write operation according to some embodiments of the present disclosure.

FIG. 3B is a schematic diagram of waveforms illustrating signals and voltages of the memory cell 120 in FIG. 1 during a write operation WR, according to some embodiments of the present disclosure. With respect to the embodiments of FIG. 1 and FIG. 3A, like elements in FIG. 3B are designated with the same reference numbers for ease of understanding. For illustration in FIG. 3B, the write operation WR is performed along with modifying the operational voltage VDD2, as will be discussed below with reference to FIG. 1 and FIG. 3B.

As illustrated in FIG. 3B, before the time T1, the node LQ is previously set to logic "0" and the node LQB is set to logic "1."

For illustration in FIG. 3B, the write operation WR starts from the time T1. The write operation WR is performed to write logic "1" data to the node LQ, and to write logic "0" data to the node LQB in FIG. 1.

In some embodiments, during the write operation WR, the write assist unit 140*a* in FIG. 1 reduces the operational voltage VDD2 from the time T1, by a bias voltage difference dV2 as illustrated in FIG. 3B.

During the same write operation WR, the operational voltage VDD1 remains equal to, or approximately equal to, the reference voltage VDD, as illustrated in FIG. 3B. The operational voltages VSS1 and VSS2 are equal to, or approximately equal to, the reference voltage VSS during the same write operation WR in some embodiments.

For illustration of operation, in response to the node LQ set to logic "0" before the time T1, the transistor TP2 in FIG. 1 is turned on. When the write operation WR is performed at the time T1, the write assist unit 140*a* start to reduce the operational voltage VDD2.

At the time T2, the write assist unit 140*a* reduces the operational voltage VDD2 by the bias voltage difference dV2. Accordingly, the reduced operational voltage VDD2 is equal to (VDD−dV2). In response to the reduced operational voltage VDD2, through the turn-on transistor TP2, the voltage level on the node LQB is also reduced at the time T2. The reduced voltage level on the node LQB causes the transistor TN1 to be turned off faster, and causes the transistor TP1 to be turned on faster, compared with operations without reducing the voltage level on the node LQB beforehand.

At the time T3, the complementary bit line signal BLB is transited to logic "0," and the bit line signal BL remains at logic "1." Correspondingly, at the time T3, the word line signal WL is transited to logic "1." In response to the word line signal WL, the transistors TN3 and TN4 are both turned on. Accordingly, the bit line signal BL of logic "1" is provided through the turn-on transistor TN3 to the node LQ, and the complementary bit line signal BLB of logic "0" is provided through the turn-on transistor TN4 to the node LQB.

After the time T3, in response to the bit line signal BL of logic "1," the voltage level on the node LQ starts to be charged to the voltage level of logic "1." In response to the complementary bit line signal BLB of logic "0," the voltage level on the node LQB starts to be discharged to the voltage level of logic "0."

As discussed above, the reduced operational voltage VDD2 reduces the voltage level on the node LQB. The reduced voltage level on the node LQB causes the transistor TP1 to be turned on faster. With the transistor TP1 being turned on faster, the voltage level on the node LQ is able to be pulled high to the operational voltage VDD1 faster, which causes the voltage level on the node LQ to be charged to the voltage level of logic "1" faster.

Correspondingly, the reduced voltage level on the node LQB causes the transistor TN1 to be turned off faster. With the transistor TN1 being turned off faster, the node LQ is able to be disconnected from the operational voltage VSS1 faster.

After the time T3, in response to the voltage level of the node LQ charged to logic "1" faster, the transistor TN2 is turned on and the transistor TP2 is turned off faster. Accordingly, the voltage level of the node LQB is able to be discharged, by the operational voltage VSS2, to logic "0" faster, compared with operations without reducing the voltage level on the node LQB beforehand. Moreover, with the reduced operational voltage VDD2, drain-to-source leakage currents through the transistors TP2 and TN2 are reduced.

Embodiments of FIG. 3A and FIG. 3B demonstrate that the write assist unit 140a reduces the operational voltage VDD1 or the operational voltage VDD2 by the bias voltage difference dV2 during the write operation WR of the memory cell 120.

In some embodiments, the bias voltage difference dV2 is similar or equal to the bias voltage difference dV1. In some embodiments, the bias voltage difference dV2 is higher than (VDD−Vth), in which Vth is a threshold voltage of the transistors TN1-TN4 and TP1-TP2, such that the reduced voltage level on the node LQ/LQB will not cause the transistors TN1-TN4 and TP1-TP2 to be switched. In some embodiments, the bias voltage difference dV2 is approximately 10% to approximately 30% of the global reference voltage VDD of the memory device 100. In some embodiments, the bias voltage difference dV2 is 100 mV.

In some embodiments, the write assist unit 140b is utilized to raise the operational voltage VSS1 or the operational voltage VSS2 without adjusting the operational voltages VDD1 and VDD2. In some embodiments, the write assist unit 140a is utilized to reduce the operational voltage VDD1 or the operational voltage VDD2 without adjusting the operational voltages VSS1 and VSS2.

In some embodiments, for example, the write assist circuit 140 performs the write operation according to a combination of embodiments illustrated in FIG. 2A, FIG. 2B, FIG. 3A and FIG. 3B. In other words, during the write operation of writing logic "0" data to the node LQ and writing logic "1" data to the node LQB, the write assist circuit 140 reduces the operational voltage VDD1 by the bias voltage difference dV2 and/or raises the operational voltage VSS2 by the bias voltage difference dV1, as illustrated in FIG. 2A and FIG. 3A. On the other hand, during the write operation of writing logic "1" data to the node LQ and writing logic "0" data to the node LQB, the write assist circuit 140 reduces the operational voltage VDD2 by the bias voltage difference dV2 and/or raises the operational voltage VSS1 by the bias voltage difference dV1, referring to FIG. 2B and FIG. 3B.

Figure 4:
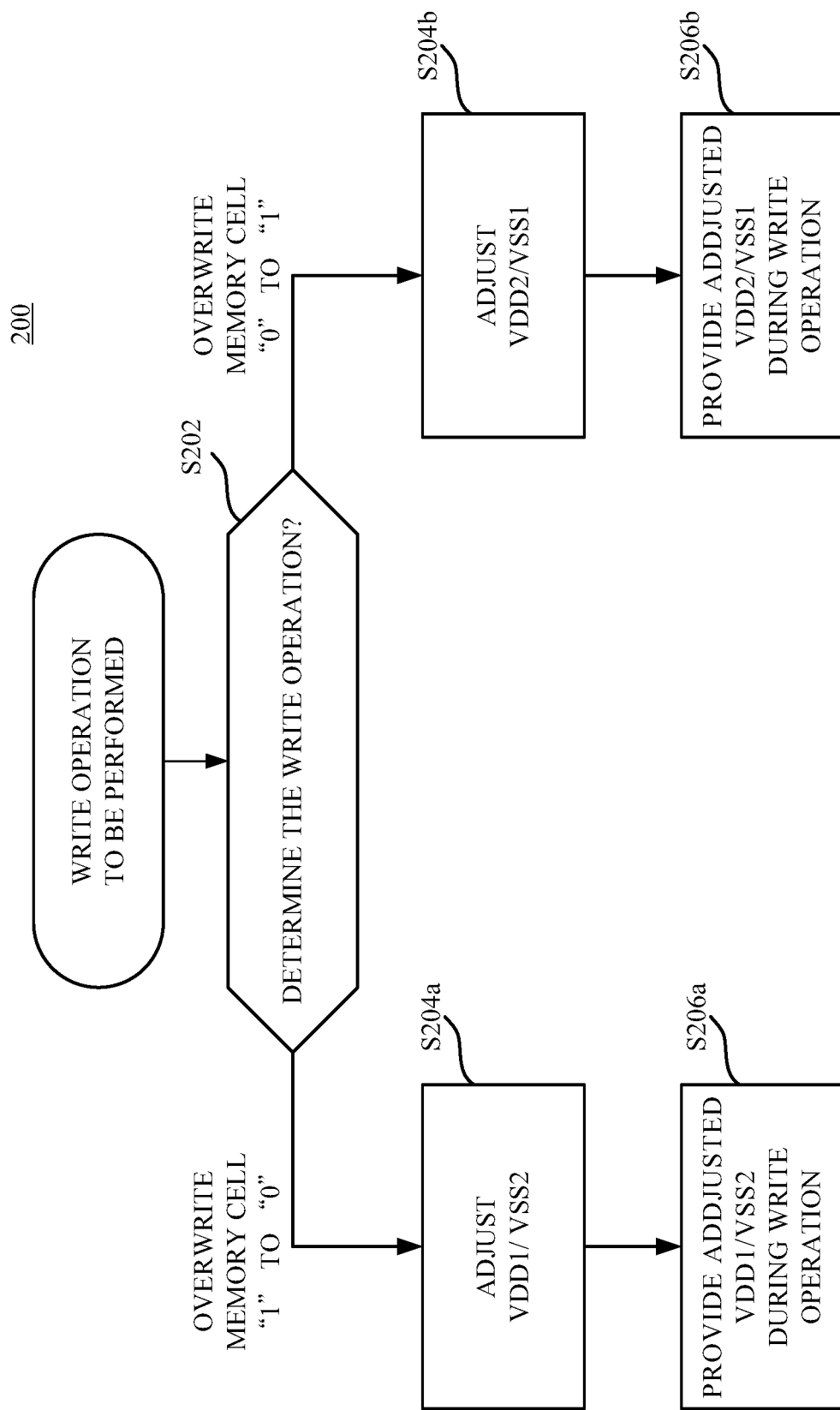
FIG. 4 is a flow chart illustrating a control method according to embodiments of the disclosure.

Reference is made to FIG. 4, which is a flow chart illustrating a control method 200 according to embodiments of the disclosure. The control method 200 is suitable to manage a write operation on the memory device illustrated in FIG. 1, for example.

As illustrated in FIG. 1 and FIG. 4, in response to a write operation going to be performed on the memory cell 120 of the memory device 100, operation S202 of the control method 200 is executed to determine whether the write operation is to overwrite the node LQ of the memory cell 120, for example from logic "1" to logic "0," or from logic "0" to logic "1."

The control method 200 is further to adjust a voltage level of at least one operational voltage during the write operation of the memory cell. In response to the node LQ of the memory cell 120 being overwritten from logic "1" to logic "0," operation S204a is executed to adjust the operational voltage VDD1, as illustrated in FIG. 3A, and/or to adjust the operational voltage VSS2, as illustrated in FIG. 2A. In response to the node LQ of the memory cell 120 being overwritten from logic "0" to logic "1," operation S204b is executed to adjust the operational voltage VDD2, as illustrated in FIG. 3B, and/or to adjust the operational voltage VSS1, as illustrated in FIG. 2B.

In some embodiments, operation S204a is performed to reduce the operational voltage VDD1 by the bias voltage difference dV2, i.e., VDD1=(VDD−dV2), as illustrated in FIG. 3A. As shown in FIG. 1 and FIG. 3A, since the voltage level of the node LQ is pulled low by the reduced operational voltage VDD1 at the time T2, the reduced voltage level on the node LQ causes the transistor TN2 to be turned off faster and causes the transistor TP2 to be turned on faster, in comparison with discharging the voltage level of the node LQ from VDD. Therefore, the voltage level of the node LQ will be discharged to logic "0" faster in comparison with discharging the voltage level of the node LQ from VDD. Since the operational voltage VDD1 is reduced, as illustrated in FIG. 3A, drain-to-source leakage currents through the transistors TP1 and TN1 are reduced.

In some embodiments, operation S204a is performed to raise the operational voltage VSS2 by the bias voltage difference, i.e., VSS2=(VSS+dV1), such as illustrated in FIG. 2A. As shown in FIG. 1 and FIG. 2A, since the voltage level of the node LQB is charged by the raised operational voltage VSS2 at the time T2, the raised voltage level on the node LQB causes the transistor TP1 to be turned off faster and causes the transistor TN1 to be turned on faster, in comparison with charging the voltage level of the node LQB from VSS. In addition, the voltage level on the node LQ will be discharged faster through the transistor TN3. Therefore, the voltage level of the node LQB will be charged to logic "1" faster, in comparison with charging the voltage level of the node LQB from VSS. Since the second operational voltage VSS2 is raised, as illustrated in FIG. 2A, drain-to-source leakage currents through the transistors TP2 and TN2 are reduced.

Based on the above, operation S204a is performed to adjust the operational voltage VDD1 as illustrated in FIG. 3A, and/or adjust the operational voltage VSS2 as illustrated in FIG. 2A.

Operation S206a is performed to provide the adjusted operational voltage VDD1, as illustrated in FIG. 3A, and/or provide the adjusted operational voltage VSS2, as illustrated in FIG. 2A, to the transistor TP1 or TN2 in FIG. 1. In some embodiments, during the write operation WR of overwriting the node LQ of the memory cell 120 from logic "1" to logic "0" as illustrated in FIG. 2A, operation S206a is performed to provide the adjusted operational voltage VSS2. In some other embodiments, during the write operation WR of overwriting the node LQ of the memory cell 120 from logic "1" to logic "0" as illustrated in FIG. 3A, operation S206a is performed to provide the adjusted operational voltage VDD1.

In response to that the memory cell 120 in FIG. 1 is overwritten from logic "0" to logic "1," operation S204b is performed to reduce the operational voltage VDD2 by the bias voltage difference, i.e., VDD2=(VDD−dV2), as illustrated in FIG. 3B. As illustrated in FIG. 1 and FIG. 3B, the voltage level on the node LQB is reduced at the time T2 due to the reduced operational voltage VDD2. As shown in FIG. 3B, since the voltage level of the node LQB is discharged by the reduced operational voltage VDD2 at the time T2, the reduced voltage level on the node LQB causes the transistor TN1 to be turned off faster and causes the transistor TP1 to be turned on faster, in comparison with discharging the voltage level of the node LQB from VDD. In addition, the voltage level on the node LQ will be charged faster through the transistor TN3. Therefore, the voltage level of the node LQ will be charged to logic "1" faster. Since the operational voltage VDD2 is reduced, as illustrated in FIG. 3B, drain-to-source leakage currents through the transistors TP2 and TN2 are reduced.

In some embodiments, operation S204b is performed to raise the operational voltage VSS1 by the bias voltage difference, i.e., VSS1=(VSS+dV1), as illustrated in FIG. 2B. As illustrated in FIG. 1 and FIG. 2B, the voltage level on the node LQ is raised at the time T2 due to the raised operational voltage VSS1. As shown in FIG. 2B, since the voltage level of the node LQ is charged by the raised operational voltage VSS1 at the time T2, the raised voltage level on the node LQ causes the transistor TP2 to be turned off faster and causes the transistor TN2 to be turned on faster, in comparison with charging the voltage level of the node LQ from VSS. In addition, the voltage level on the node LQB will be discharged faster through the transistor TN4. Therefore, the voltage level of the node LQ will be charged to logic "1" faster, in comparison with charging the voltage level of the node LQ from VSS. Since the operational voltage VSS1 is raised, as illustrated in FIG. 2B, drain-to-source leakage currents through the transistors TP1 and TN1 are reduced.

Based on the above, operation S204b is performed to adjust the operational voltage VDD2, as illustrated in FIG. 3B, and/or adjust the operational voltage VSS1, as illustrated in FIG. 2B.

Operation S206b is performed to provide the adjusted operational voltage VDD2, as illustrated in FIG. 3B, and/or provide the adjusted operational voltage VSS1, as illustrated in FIG. 2B, to the transistor TP2 or TN1 in FIG. 1. In some embodiments, during the write operation WR of overwriting the node LQ of the memory cell 120 from logic "0" to logic "1" as illustrated in FIG. 2B, operation S206b is performed to provide the adjusted operational voltage VSS1. In some other embodiments, during the write operation WR of overwriting the node LQ of the memory cell 120 from logic "0" to logic "1" as illustrated in FIG. 3B, operation S206a is performed to provide the adjusted operational voltage VDD2.

In some embodiments, a device is disclosed to include a memory cell and a write assist circuit. The memory cell includes a first inverter and a second inverter cross-coupled with the first inverter. The first inverter is operated with a first operational voltage and a third operational voltage, and the second inverter is operated with a second operational voltage and a fourth operational voltage. The write assist circuit is coupled to the memory cell. During a write operation of the memory cell, the write assist circuit is configured to adjust a voltage level of the first operational voltage, the second operational voltage, the third operation voltage, the fourth operation voltage, or a combination thereof, by a bias voltage difference.

Also disclosed is a method including following operations. During a write operation of a memory cell, a first inverter, a second inverter, or the combination thereof, in the memory cell, is operated with at least one operational voltage having a voltage level that is adjusted during the write operation of the memory cell.

Also disclosed is a device including a memory cell and a write assist circuit. The memory cell includes a first transistor and a second transistor operating together as a first inverter, and a third transistor and a fourth transistor operating together as a second inverter. The write assist circuit is coupled to the memory cell, and during a write operation of the memory cell, is configured to provide at least one operational voltage having a voltage level that is adjusted during the write operation of the memory cell, to the first transistor, the second transistor, the third transistor, the fourth transistor, or the combination.

The foregoing outlines features of several embodiments so that those of ordinary skill in the art may better understand aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a memory cell comprising a first inverter and a second inverter cross-coupled with the first inverter, wherein the first inverter is operated with a first operational voltage and a third operational voltage, and the second inverter is operated with a second operational voltage and a fourth operational voltage,
   wherein during a write operation of the memory cell, the first operational voltage and the second operational voltage are configured at different voltage levels, and the third operational voltage and the fourth operational voltage are configured at the same voltage level.

2. The device of claim 1, further comprising:
   a write assist circuit configured to adjust one or more of the first operational voltage, the second operational voltage, the third operational voltage and the fourth operational voltage by a bias voltage difference.

3. The device of claim 2, wherein the bias voltage difference is less than a threshold voltage of a transistor of the first inverter or the second inverter, and approximately 10% to approximately 30% of a reference voltage.

4. The device of claim 2, wherein the write assist circuit is further configured to provide the first operational voltage and third operational voltage to the first inverter, and the second operational voltage and fourth operational voltage to the second inverter,
   wherein when the memory cell is not in the write operation, the first operational voltage and the second operational voltage are configured at the same voltage level.

5. The device of claim 2, wherein
   the fourth operational voltage is higher than the third operational voltage during a write operation of writing first data to an output node of the first inverter and an input node of the second inverter, and
   the third operational voltage is higher than the fourth operational voltage during a write operation of writing second data to the output node of the first inverter and the input node of the second inverter.

6. The device of claim 2, wherein
   the first operational voltage is lower than the second operational voltage during a write operation of writing first data to an output node of the first inverter and an input node of the second inverter, and
   the second operational voltage is lower than the first operational voltage during a write operation of writing second data to the output node of the first inverter and the input node of the second inverter.

7. The device of claim 6, wherein a voltage of the input node of the second inverter is reduced when the second operational voltage is reduced to be lower than the first operational voltage.

8. The device of claim 1, wherein during a write operation of writing first data to an output node of the first inverter and an input node of the second inverter,
the first inverter is operated with the first operational voltage which is lower than the second operational voltage, and
the second inverter is operated with the fourth operational voltage which is higher than the third operational voltage.

9. The device of claim 1, wherein during a write operation of writing first data or second data to an output node of the first inverter and an input node of the second inverter,
the memory cell is operated with the first operational voltage, the second operational voltage, the third operational voltage and the fourth operational voltage,
wherein the first operational voltage, the second operational voltage, the third operational voltage and the fourth operational voltage are different from each other.

10. The device of claim 1, wherein the memory cell further comprises:
a first write transistor and a second write transistor,
wherein an output node of the first inverter and a input node of the second inverter is coupled to a bit line through the first write transistor, and an input node of the first inverter and an output node of the second inverter are coupled to a complementary bit line through the second write transistor.

11. A method, comprising:
providing a first operational voltage and a third operational voltage to a first inverter in a memory cell, and
providing a second operational voltage and a fourth operational voltage to a second inverter in the memory cell,
wherein the first operational voltage and the second operational voltage are provided with different voltage levels and the third operational voltage and the fourth operational voltage are provided with the same voltage level during a write operation of the memory cell.

12. The method of claim 11, further comprising:
reducing the first operational voltage or the second operational voltage by a bias voltage difference.

13. The method of claim 11, further comprising:
raising the third operational voltage or the fourth operational voltage by a bias voltage difference in response to the write operation of the memory cell.

14. The method of claim 11, further comprising:
reducing the second operational voltage; and
raising the third operational voltage.

15. The method of claim 11, further comprising:
determining the write operation in order to adjust the first operational voltage, the second operational voltage, the third operational voltage and the fourth operational voltage,
when in a write operation of writing first data, adjusting the first operational voltage or the fourth operational voltage, and
when in a writing operation of writing second data, adjusting the second operational voltage or the third operational voltage.

16. The method of claim 15, wherein the first operational voltage is lower than the second operational voltage during the write operation of writing first data.

17. The method of claim 15, wherein the second operational voltage is lower than the first operational voltage during the write operation of writing second data.

18. A device, comprising:
a memory cell comprising a first inverter and a second inverter cross-coupled with the first inverter, wherein the first inverter is operated with a first operational voltage and a third operational voltage, and the second inverter is operated with a second operational voltage and a fourth operational voltage,
wherein during a write operation of the memory cell, the first operational voltage and the second operational voltage are configured at different voltage levels, and, not in the write operation, the first operational voltage and the second operational voltage are configured at the same voltage level.

19. The device of claim 18, wherein during the write operation,
the third operational voltage and the fourth operational voltage are configured at different voltage levels under the condition that the first operational voltage and the second operational voltage are configured at the same voltage level.

20. The device of claim 18, wherein a voltage difference between the first operational voltage and the second operational voltage is less than a threshold voltage of a transistor of the first inverter or the second inverter, and approximately 10% to approximately 30% of a reference voltage.

* * * * *